United States Patent
Williams

(10) Patent No.: US 9,455,370 B2
(45) Date of Patent: Sep. 27, 2016

(54) METHOD FOR COATING A SOLAR PANEL

(71) Applicant: Solar Developments Pty Ltd, Dural (AU)

(72) Inventor: Luke Williams, Dural (AU)

(73) Assignee: Solar Developments Pty., Ltd., Dural, New South Wales (AU)

( * ) Notice: Subject to any disclaimer, the term of this patent is extended or adjusted under 35 U.S.C. 154(b) by 0 days.

(21) Appl. No.: 14/417,020

(22) PCT Filed: Feb. 21, 2013

(86) PCT No.: PCT/AU2013/000157
§ 371 (c)(1),
(2) Date: Jan. 23, 2015

(87) PCT Pub. No.: WO2014/015360
PCT Pub. Date: Jan. 30, 2014

(65) Prior Publication Data
US 2015/0207021 A1    Jul. 23, 2015

(30) Foreign Application Priority Data
Jul. 23, 2012  (AU) ................................ 2012903137

(51) Int. Cl.
*H01L 21/66* (2006.01)
*H01L 31/18* (2006.01)
(Continued)

(52) U.S. Cl.
CPC ........... *H01L 31/186* (2013.01); *C09D 7/1216* (2013.01); *C09D 7/1291* (2013.01);
(Continued)

(58) Field of Classification Search
CPC ..... H02S 20/23; H01L 31/186; H01L 22/14; H01L 31/02164; H01L 31/02167; C09D 7/1291; C09D 7/1216; Y02E 10/50; Y02B 10/12

USPC ...... 438/7, 26, 64, 496, 24, 65, 72; 136/252, 136/255, 264, 206
See application file for complete search history.

(56) References Cited

U.S. PATENT DOCUMENTS

2007/0287766 A1   12/2007   Kuczynski et al.
2011/0083731 A1*   4/2011   Gadomsky ............ B82Y 30/00
                                                          136/256

FOREIGN PATENT DOCUMENTS

CN          101027368 A       8/2007
DE     10 2009 019 885 A1    11/2010
(Continued)

OTHER PUBLICATIONS

Backstrom, R. et al., Firefighter Safety and Photovoltaic Installations Research Project; Underwriters Laboratories Inc., Nov. 29, 2011.
(Continued)

*Primary Examiner* — Thinh T Nguyen
(74) *Attorney, Agent, or Firm* — Dana M. Gordon; Foley Hoag LLP

(57) ABSTRACT

The present invention relates to a method for coating a solar panel to reduce the amount of light being received by the solar panel's photovoltaic cells and reduce their electrical output. The method comprises the step of coating the light-receiving area of said solar panel with a sufficient thickness of a coating composition which is adapted to reduce the amount of light reaching the photovoltaic cells such that the resulting electrical output of said solar panel is reduced to below a level which causes physiological injury. The invention also relates to a composition for coating the light-receiving area of a solar panel comprising: a binder and an opacifier, wherein the opacifier is included in a sufficient quantity such that a predetermined film thickness of said composition reduces light transmission therethrough such that the resulting electrical output of said solar panel is reduced to below the predetermined level.

22 Claims, 4 Drawing Sheets

(51) Int. Cl.
*H01L 31/042* (2014.01)
*H02S 20/23* (2014.01)
*C09D 7/12* (2006.01)
*H01L 31/0216* (2014.01)

(52) U.S. Cl.
CPC ........ *H01L 22/14* (2013.01); *H01L 31/02164* (2013.01); *H01L 31/02167* (2013.01); *H02S 20/23* (2014.12); *H02S 40/00* (2013.01); *Y02B 10/12* (2013.01); *Y02E 10/50* (2013.01)

(56) References Cited

FOREIGN PATENT DOCUMENTS

| EP | 1749862 | A2 | 2/2007 |
| GB | 2011444 | A | 7/1979 |
| JP | 2004284904 | A | 10/2004 |
| WO | WO-01/02496 | A2 | 1/2001 |
| WO | WO-2005/067495 | A2 | 7/2005 |

OTHER PUBLICATIONS

International Search Report for PCT/AU2013/000157, dated May 9, 2013.
International Preliminary Report on Patentability for PCT/AU2013/000157, dated Nov. 28, 2013.
Tian, L., Solar Photovoltaic Lighting Handbook, Kluwer Academic Publishers, 2010, pp. 253-254.
"Secured Solar Starter Kit to Prevent Solar Panel Fire Hazard/SecuredSolar", retrieved from https://web.archive.org/web/201206212110107/http://securedsolar.com/securedsolar-starter-kit, Jun. 21, 2012.
Supplementary European Search Report from corresponding application EP 2874760 dated Apr. 12, 2016.

* cited by examiner

METHOD FOR COATING A SOLAR PANEL

RELATED APPLICATIONS

The present application is the U.S. national phase of International Patent Application No. PCT/AU2013/000157, filed Feb. 21, 2013; which claims the benefit of Australian provisional patent application number 2012903137, filed Jul. 23, 2012.

FIELD OF THE INVENTION

The present invention relates to a method for switching off the electrical energy produced by a solar panel to render the panel electrically safe. In particular, the present invention relates to a sprayable, pourable or brushable composition and use of the composition for coating a solar panel during a fire or flooding scenario, or even to electrically neutralise the panel for maintenance purposes, and will be described hereinafter with reference to this application. However, it will be appreciated that the invention is not limited to this particular field of use.

BACKGROUND OF THE INVENTION

The following discussion of the prior art is provided to place the invention in an appropriate technical context and enable the advantages of it to be more fully understood. It should be appreciated, however, that any discussion of the prior art throughout the specification should not be considered as an express or implied admission that such prior art is widely known or forms part of common general knowledge in the field.

As energy costs rapidly rise, society is desperately searching for ways to reduce greenhouse gas emissions. Solar energy has become one of the most widely employed of the options being considered as an alternative energy source. A solar cell (also called photovoltaic cell or photoelectric cell) is a solid state electrical device that converts the energy of light directly into electricity by the photovoltaic effect. Assemblies of cells are used to make solar modules which are used to capture energy from sunlight, and which are commonly known as solar panels.

Interest in solar energy technology is rapidly on the rise, with many government bodies and industry pouring millions of dollars each year into conducting research into ever more efficient cells. It has been estimated that photovoltaic cell production has been doubling every two years and is the world's fastest growing energy technology. It is also estimated that about 2% of Australian homes have solar panel systems installed, which is forecast to rise substantially over the coming decades. Other countries have already adopted the technology to a greater degree, with some countries having solar panel systems installed on more than 5% of dwellings. Solar technology is not just applicable to urban buildings; it also finds particular utility in commercial, remote or rural applications where it is difficult or costly to connect mains power and, due to advances in efficiency, in commercial and industrial applications.

Solar panels installed on the roof of a building absorb sunlight during the day and instantly convert it into direct current (DC) electrical energy. The electricity is then run into an inverter that converts the DC power into standard alternating current (AC) for use in the home. This electricity is synchronized with the utility power whenever the solar grid is producing electricity, and the electrical panel distributes the solar energy and utility power throughout the home.

In some instances it is not uncommon during peak sunlight hours for the utility meter to spin backwards when the solar electricity generated exceeds the home's needs. In this case, the excess power can be sold back to the utility company for a credit. Utility power is automatically provided at night and during times when the home's demand exceeds the solar production. Some systems also include batteries that store electrical energy for use when the sun is not shining.

There are issues, however, associated with solar panel systems, and in particular the safety challenges they present to fire fighters and emergency workers. For example, in 2002 a fire fighter in Switzerland was injured as the result of an electrical shock he received from a solar panel, and in 2007 a fire fighter in Arizona received an indirect electrical shock while fighting a house fire. In this case, the home electricity was secured at the utility box, however the fire fighters operating at this incident were unaware that the solar panel system was still energized. Accordingly, fire fighters and emergency workers are now almost universally trained that when conducting fire ground operations on a building with a solar panel system, the solar panel system must be assumed to be still energized at all times. In other words, even if a building's electrical utilities are shut down at the panel, everything electrically downstream of the utility box must be assumed to be still energized. Whilst it is known that environmental factors can affect a solar panel system's performance, e.g. cloud cover, smog, and temperature, fire fighters and emergency workers are nevertheless trained to always treat the system as if it were energized electrical equipment.

In an attempt to circumvent this problem, some fire fighters have attempted to black out the solar panel system by using a salvage cover to block out the sunlight. In these cases the energy created by the system can be reduced, but this solution does not completely block out the sun, and the system can still produce enough electricity to shock a potential victim. This also means that a fire fighter and emergency worker has to climb onto the roof and install the cover, which presents its own dangers. Furthermore, in high wind conditions it is not uncommon for the cover to be blown off, or even inadvertently removed or partially displaced by the high powered jet of water from the fire fighting equipment.

In another solution, some fire fighters have attempted to cover solar panels with standard fire fighting foam to block out the sunlight, however it has been found that this provided a similar result, namely, sunlight was still able to penetrate through the foam and the solar panel system continued to create electrical energy. In this particular example, it was found that the foam had a tendency to slide off the panels.

There are other electrical dangers which solar panels present. For example, if a fire fighter or and emergency worker were to break the glass protecting a solar cell, this could potentially discharge all of the inherent energy in the system, which could be deadly. Further, fire fighters and emergency workers must be extremely cautious when entering an attic or a roof cavity of a structure with a solar cell system on the roof as exposed wires can fill through the roof into the cavity and shock rescue personnel.

Other dangers relate to the solar cells themselves, which include the use of many hazardous chemicals. To explain, during fire or an explosion a solar cell can release these hazardous chemicals and present an inhalation hazard to fire fighter and emergency workers working around them and any civilians which are downwind. In the case of a small residential system, the exposure hazard is relatively small.

Larger arrays like those found on some commercial buildings, however, are more likely to be an exposure hazard for fire fighter and emergency workers and the public.

Once a fire has been extinguished, a solar panel continues to present a real danger to those who are employed to clean up the site. Even if the structure has collapsed and the solar panel is buried underneath rubble it is still possible for the panel to produce an electrical current. Other issues can be caused during flooding. For example, if the mains power switchboard is underneath the water line and the roof structure remains above the waterline the panels will still be able to generate electrical power.

One other problem which solar panels present, is that the "hot stick" many fire departments carry on their engines and ladders detects only alternating current, and using a hot stick to determine if a solar panel system is energized will mislead fire fighters into a false sense of security because everything between the solar cells and the inverter is direct current. Although there may be no current, the wires from the array will have a voltage potential that cannot be detected through non contact means.

It will also be understood that the safety of the fire fighter is paramount, and typically modern fire fighting units engage in "dynamic risk assessment", which commences from when the fire fighters depart the station. In other words, information on the fire itself the type of the building on fire, its potential contents, and even information on the surrounding buildings is fed back to the fire fighters before and whilst in transit to the fire. In this way, they can arrive at the fire fully informed and are therefore able to make quick and educated decisions. The fire fighters will not commence operations, however, until the risks have been identified and minimised, and in cases where there are solar panels present valuable time can be wasted in rendering the panels safe by conventional methods. Life and property can be put at risk due to this delay.

It is an object of the present invention to overcome or ameliorate one or more of the disadvantages of the prior art, or at least to provide a useful alternative.

SUMMARY OF THE INVENTION

According to a first aspect the present invention provides a method for coating a solar panel to reduce the amount of light being received by solar panel's photovoltaic cells and reduce their electrical output, the method comprising the steps of:

coating the light-receiving area of said solar panel with a sufficient thickness of a coating composition which is adapted to reduce the amount of light reaching the photovoltaic cells such that the resulting electrical output of said solar panel is reduced to below a predetermined level.

According to a related aspect the present invention provides a composition for coating the light-receiving area of a solar panel to reduce the amount of light being received by the solar panel's photovoltaic cells, the composition comprising:

a binder; and
opacifier,
wherein said opacifier is included in a sufficient quantity such that a predetermined film thickness of said composition reduces light transmission therethrough such that the resulting electrical output of said solar panel is reduced to below a predetermined level.

According to yet a further aspect the present invention provides apparatus for delivering a coating composition onto the light-receiving area of a solar panel, the apparatus comprising:

a container for holding a quantity of said coating composition;
a delivery nozzle for delivering a spray or jet of said coating composition; and
a pump for pumping said coating composition from said container and through said delivery nozzle,
wherein said pump and said delivery nozzle are configured such that said coating composition is deliverable as a burst of a relatively confined jet or spray and to a distance of at least 2 meters.

The container, delivery nozzle and pump are in fluid communication.

According to a related aspect the present invention provides a system for delivering a coating composition onto the light-receiving area of a solar panel, the system comprising:

a coating composition adapted to reduce light transmission to said solar panel when coated onto said light-receiving area;
a container for holding a quantity of said coating composition;
a delivery nozzle for delivering a spray or jet of said coating composition; and
a pump for pumping said coating composition from said container and out through said delivery nozzle,
wherein said pump and said delivery nozzle are configured such that said coating composition is deliverable as a burst of a relatively confined jet or a spray and at a distance of at least 2 meters.

Preferably the predetermined electrical output level of said solar panel below that which causes physiological injury, as discussed further below.

Preferably the pump and delivery nozzle are configured such that said coating composition is deliverable as a burst of a relatively confined jet or spray and to a distance of about 2, 5, 10, 15, 20, 30, 40, or 50 meters.

According to a further aspect the present invention provides the use of a coating to coat the light-receiving area of a solar panel such that the resulting electrical output of said solar panel is reduced to below a predetermined level. Preferably a sufficient thickness of the coating composition is applied to reduce the amount of light reaching the solar panel's photovoltaic cells such that the resulting electrical output of said solar panel is reduced to below a predetermined level.

It will be appreciated that the present invention enables the rapid and efficient electrical neutralisation of a solar panel system. Advantageously, the panel can be neutralised from a safe distance from the panel itself, and therefore avoid the need for fire fighters and/or emergency workers to physically climb onto the top of a structure supporting the panel to electrically neutralise the panel. The method of the invention is directed at improving the safety surrounding the use of installed solar panels, especially in fire and flooding scenarios. However, the invention can also be utilised to pre-coat a solar panel before shipping and delivery, such that the solar panel arrives at its intended place of installation in an electrically-neutralised state, and then once electrically connected the coating can be removed to energise the photovoltaic cells and commence generating power.

The invention can also be utilised to electrically neutralise panels which are electrically frailty. In the past, solar panels have been sold which have a faulty electrical connection which constitutes a fire hazard. People who have these dangerous solar panels on their roofs are advised to disconnect them in a 'safe manner', which requires a professional electrician. It would be preferable for the electrician to be able to electrically neutralise the panel before attempting to disconnect, and eventually reconnect, live wires. A faulty electrical connection can also cause sparks to jump onto the roof and cause a fire. These sparks can be eliminated by electrically neutralising the solar panel by applying the coating according to the invention.

Preferably the solar panel's electrical output is reduced to zero, or at the very least to below that which causes physiological injury. The present invention is also particularly useful for electrically neutralising a solar panel before, during, or after the instance of a fire to minimise the possibility of electrocution to those persons fighting the fire, or even those persons who are cleaning up the aftermath of a fire. The invention also finds utility in being able to electrically neutralise a panel quickly, efficiently, and cost effectively for maintenance or inspection purposes.

It will further be appreciated that the present invention enables electrical neutralisation of a solar panel without destroying it, such that the panel can be reused or recycled in the future. Further still, the composition of the invention preferably resists being removed in high wind conditions or washed off with water/rain, and will relatively easily be released from the panel and any surrounding structures (e.g. roof tiles) upon which the coating composition has been applied. It will be appreciated that the coating of the invention is sacrificial, in that it is designed to be applied and then removed when required, preferably as a single cohesive sheet without marking the solar panel or the surrounding structures. It will further be appreciated that the coating of the invention is preferably formulated to include fire retardant additives, and/or UV-stabilisers such that the coating does not degrade in strong sunlight, as some coatings will need to remain in place for many months or even years in the case of a building which is to remain unoccupied for extended periods of time. However, in other embodiments, the coating may contain no UV-stabilisers so that the coating will degrade and fall away over time. Preferably a film of the coating is not water soluble.

In relation to the coating composition, it will be appreciated that there is a relationship between film thickness and opacifier concentration to achieve a critical or predetermined reduction in sunlight transmission such that the resulting electrical output of the solar panel is reduced to below a predetermined level. To explain, a greater thickness of deposited coating film will require a relatively reduced amount of opacifier to give said predetermined reduction in light transmission, and vice versa. The present invention is not intended to be limited to a specific amount of opacifier or specific film thickness. It is contemplated that all combinations of film thickness and opacifier concentrations which provide the required reduction in sunlight transmission fall within the purview of the invention. However, the coating composition should preferably have a high opacifier loading to maximise the reduction in light transmission and to minimise the amount of coating composition which is required to be applied.

The possible film thickness of the composition is between about 1 to 2000 micron. However, preferred film thicknesses are around 5, 10, 25, 50, 75, 100, 150, 200, 250, and 500 micron. Opacifier concentrations between 5 and 50% are possible, but the opacifier is typically incorporated at around 5-20 wt %.

As a person skilled in the art will be aware, an opacifier is a generally inert substance added to a coating system (in this case the binder) in order to make the coating system opaque and to reduce the transmission of incident light. Opacifiers typically have a refractive index substantially different from the binder, and titanium dioxide (in both anatase and rutile forms) and/or calcium carbonate are typically used as opacifiers in surface coatings. However, other opacifiers will be known to the skilled person, such as zinc oxide, talc, carbon black, expanded or expandable thermoplastic microspheres (see Morehouse, U.S. Pat. No. 3,615,972), and "ROPAQUE OP-62", manufactured by Rohm and Haas Company (see U.S. Pat. No. 4,427,836), and like materials.

Preferably the sunlight transmission is reduced to 0%, or below 1, 2, 3, 4, 5, 10, 15, 20, 25, 30, 35, 40, 45, 50, 55 60, 65, 70 or 75% of the light received in the absence of the composition of the invention, i.e. the incident light. Preferably 100% of the light-receiving area is coated.

It will be appreciated that the composition reduces the amount of sunlight being received by the photovoltaic cells which in turn reduces the electrical output of the solar panel. In one preferred embodiment, a single coating is applied to achieve the predetermined or critical reduction in light transmission. However multiple coatings may be required.

The present invention provides a coating material and the use of a coating material to coat the surface of a solar panel to block the sunlight transmitted to the photovoltaic cells to thereby effectively switch the panel off. Preferably the coating reduces the current to zero, or at least below a predetermined or threshold level such as below the physiological injury level as described by line b, page 22. Australian Standard 60479.1:2003, which is incorporated herein by reference. Preferably the solar panel is electrically neutralised. It will be appreciated that the present invention is directed at reduction of the DC current which is produced by the solar panel to below the threshold of perception, and/or to the threshold of reaction, as defined in the above Australian Standard. Furthermore, an advantage of the present invention is to reduce the probably of ventricular fibrillation to below 50%, preferably to below 5%, and more preferably to below 1%.

It will be appreciated that the coating composition is preferably formulated such that it is not electrically conductive.

Binders suitable for the present invention are those which are water-based, as the coating composition could possibly be directed into or near a fire. It will be appreciated, however, that a minor amount of volatile organic compound (VOC) can be incorporated into the composition. In one of the preferred coating compositions of the invention, water will account for about 20 to about 95 wt % of the composition and for ease of application by brush, roller or spray, the composition may typically comprise about 50 to 90 wt % and most preferably about 60 to 85 wt % water in the final composition. The combined non-volatile portions of the water-reducible film-forming coating composition of the invention will typically account for only about 5 wt %.

The binder of the coating composition of the invention comprises at least one water-reducible film-forming polymer. As used herein, the term "film-forming polymer" means that the polymer can form a continuous film upon evaporation of all solvent or carrier and/or upon cure of the polymer. As used herein, the term "water reducible" is meant to include all polymers which can be stably dispersed in water and is intended to include water-soluble polymers, dispersions, emulsions, and latices wherein the volatile content is, or can be, predominantly water.

Water-soluble polymers are generally understood in the art as those materials with sufficient hydrophilic and/or ionic groups (such as acid or amine groups) on the polymer to provide water solubility. For many applications it is preferred to utilize polymers having a number average molecular weight of at least about 2,000.

One common approach to producing water-soluble polymers is by the condensation reaction of reactants having a stoichiometric excess of ionic groups, such as acid or amine groups which can subsequently be neutralized to provide water solubility. Water-soluble polyesters, polyureas, polyurethanes and other polymers can be prepared in this manner.

For example, the condensation polymerization reaction of reactants having a stoichiometric excess of acid or anhydride groups with reactants having hydroxyl, amine and/or epoxy functionality can produce acid functional polymers which can be neutralized with a base, such as an amine to provide water solubility. Similarly, water-soluble polymers can be produced by the reaction of reactants having a stoichiometric excess of amine functionality with co-reactants such as polycarboxylic acids, polyepoxides, polyisocyanates and other materials to produce amine functional polymers which can be neutralized with acids to provide water solubility.

Another method well known in the art to produce water-soluble polymers is by the free radical polymerization of unsaturated groups having acid or amine functionality such as acrylic acid, methacrylic acid, dimethylaminoethyl acrylate, with other unsaturated monomers followed by neutralization of the ionic groups to provide water solubility.

Representative examples include water-reducible acrylic modified polyesters such as taught in U.S. Pat. No. 4,735, 995; acid-functional air drying polyurethanes such as taught in U.S. Pat. No. 5,104,737, and polyurethane dispersions such as taught in U.S. Pat. Nos. 5,310,780 and 5,912,299.

Many other methods for producing water-soluble polymers are also known in the art. Representative commercially available water-soluble resins include Kelsol DV-5862, a water-reducible alkyd from Reichhold Chemicals and Rezimac. WR 73-7331, a water-reducible epoxy resin from Eastman Chemical.

Other water-dispersible film-forming polymers include the latex resins. Representative examples include styrene butadiene latices, polyvinyl acetate latices, acrylic latices, and many others. These types of polymers are frequently prepared by emulsion polymerization wherein the reactive monomers and appropriate initiators are emulsified in water in the presence of emulsifying agents to provide a stable dispersion of polymer particles in water. For some applications of this invention, it is especially useful to utilize latex resins which are more hydrophobic. These types of latices are representatively prepared by utilizing monomers that are more hydrophobic, and by using surfactants or emulsifying agents which are less water sensitive or which can be incorporated directly into the latex polymer itself.

Representative examples of some latices useful in the practice of this invention include the latex polymers taught in PCT application PCT/US99/23428 (WO 00/22016), entitled Latex Polymer Compositions; and U.S. Pat. No. 5,739,196. Representative commercially available latex resins useful in the practice of this invention include Rhoplex®. Multilobe 200 (acrylic latex), Rhoplex®. AC-264 (acrylic latex) both from Rohm and Haas Company, and Neocar®. 2300 (vinyl versatate based latex), UCAR®. 651 (acrylic copolymer), Ultracryl®. 701 (acrylic latex), Neocar®. 820 (acrylic latex), and Neocar®. 7657 and 7658 (hydrophobic acrylic latices) all available from Union Carbide Corporation.

Preferably the binder has a Tg below room temperature and is therefore rubbery.

Preferably the composition is formulated to have a low surface tension in order to enable it to adhere and to wet the surface to which it is being applied. Surface tension modifiers can be included in the coating composition so as to improve coatability. These materials lower the surface tension of the composition so that the composition will "wet" the substrate thereby facilitating the application process. Useful surface tension modifiers include those marketed under the trade names Surfynol® 104 and Surfynol® TG available from Air Products and Chemicals Inc. The major ingredient in these surface tension modifiers is: 2,4,7,9,-tetramethyl-5-decyne-4,7,diol. Other surface tension modifiers and mixtures of modifiers can also be used.

Preferably the composition is adapted to be sprayable from a distance onto solar panels. In preferred embodiments the composition is formulated to have a rheological profile such that the composition remains as a "jet" or a stream rather than atomising when discharged from suitable spray apparatus. Preferably the composition remains substantially in jet form for a distance up to 2, 4, 6, 8, 10 or even 15 meters. In other embodiments, the composition is applyable by a brush or roller, or even applied directly by pouring onto the solar panel.

Preferably the composition is formulated to have a pre-determined rheological profile, namely, the composition displays a low viscosity under high shear conditions, such as being sprayed onto the solar panel, and high viscosity under low shear conditions, such as once deposited onto the panel. It will be appreciated that the composition is preferably adapted to stay in place once deposited and resist sagging or running, as any significant flow of the composition once deposited wilt result in a reduction in thickness of the final film and therefore increase the light being be transmitted through to the light-receiving area of the solar panel.

Preferably the composition is also adapted to substantially remain in suspension when awaiting use or for long periods of time. This is preferred as emergency workers will not have time to stir the ingredients back into suspension when they arrive at an incident.

Preferably the composition is adapted to dry quickly, and for example is tacky within 1-5 mins and substantially dry within 5-10 mins. In order to achieve tackiness within a predetermined time, preferably the binder includes one or more crosslinker. Persons skilled in the art will be aware of suitable such crosslinkers.

Preferably the resultant dried film is coherent, in that it can be relatively easily peeled away from a non-porous surface as a single sheet. This feature enables the film to be relatively easily removed after the solar panel has been treated/coated to electrically neutralise it, and enables the solar panel to be reused. Preferably a "release agent" is incorporated into the composition. Such release agents are well known to the skilled person, and include materials such as silicone-containing compounds. Preferably the composition includes additives to improve the fire resistance of the coating composition. Such additives are well known to the skilled person, and include materials such as ceramic microspheres or mono ammonium phosphate.

In some preferred embodiments, the composition is absent UV inhibitors, or includes additives which increase or accelerate the UV-destruction of the resultant film. This embodiment is particularly useful in case where access to the panel is difficult and where the intention is to turn off the solar panel but allow power generation to resume after a short period of time. Preferably the composition is adapted such that a film of the coating composition is substantially degraded by sunlight within about 2 to 6 weeks. In this embodiment, once the resultant film has served its useful life and is no longer needed, the action of the sun will degrade the film and it will become friable and fall away in the wind and rain. This is especially useful as any overspray which is deposited onto porous substrates such as concrete tiles etc, will likely be somewhat absorbed therein and will resist peeling away. Therefore the absence of a UV inhibitor or the presence of a decomposition accelerant will 'remediate' the oversprayed areas with time. In some embodiments, however, a relatively high amount of UV inhibitor is included so that the film is not degraded by sunlight so that the solar panel remains electrically inactive for extended periods of time.

In some preferred embodiments, the composition includes release agents thereby allowing the coating film to be relatively easily peeled away from the surface upon which it has been applied. Such additives will be well known to the skilled person.

It will be appreciated that in some cases, the coating composition of the invention can simply be poured onto the solar panel. However, in many cases the solar panel will need to be coated from a safe distance, which could be 5, 10, 15, 20 or more meters away, and could even be at an elevated height, such as on the top of a 2-story roof. In such cases specialised delivery apparatus is required to deliver a dose of the coating composition onto the solar panel. Preferably the delivery apparatus is capable of containing a volume of the coating composition of the invention and delivering a short burst of the coating composition under high pressure, and delivering that quantity in a relatively confined stream or jet. In this way, a pulse of coating composition can be delivered relatively accurately onto the solar panel with minimal overspray and wastage. It will also be appreciated that the coating composition is adapted to enable to it to be delivered as a cohesive jet of fluid. In other words, the coating composition is adapted to avoid atomisation when delivered via a nozzle. This can be achieved controlling the rheological profile of the coating composition.

One suitable delivery apparatus includes a container or reservoir for the coating composition, a high pressure pump, and a delivery nozzle. The delivery nozzle can be connected to the pump by means of a hose to aid maneuverability. Suitable pumps will be known to those in the art, for example a centrifugal pump, a piston pump, a helical pump, and a screw pump. In other embodiments an air compressor is used to pressurise the coating material in the container/reservoir. Preferred gases are those that will retard fire, such as nitrogen, argon, and carbon dioxide. Other fire-retardant gases will be known to the skilled person.

As mentioned previously, the composition can be alternatively applied by brush, roller or by bucket.

Preferably the composition is deposited on a solar panel which itself is not on fire. However, in some circumstances the solar panels can also catch fire. In these cases it is advantageous to coat them not only to minimise any risk of electrocution, but to also douse the fire. It is contemplated that if a sufficient quantity of water is utilised in the coating composition then the solar panel could be extinguished as well as electrically switched off.

It will be understood that if the fire is at night, then there is little risk of electrocution from the solar panels. However, when daylight occurs then the panels can become 'live' again and could cause a risk for anyone cleaning up the site. Therefore, it is also advantageous to coat the panels even during a night fire as a means of preventing electrocution during daylight hours.

Many kinds and types of prior art surface coatings are known in the art. Some coatings are used for decorative purposes and would not be suitable for the present invention, namely to minimise the amount of transmitted light to electrically switch of the panels. Other coatings are formulated with a specific functional purpose in mind, for example they are formulated to prevent damage to a surface and therefore provide a tenacious tough film which can be relatively easily peeled from a non-porous surface. The coating of the invention is adapted to prevent light transmission through a dried film thereof, but also preferably provides a tenacious tough film which can be relatively easily peeled from a substrate. Accordingly, the composition is formulated to either have a relatively high loading of opacifiers which are chosen to reduce or inhibit light transmission through the film, or are chosen to have a high degree of light reflectance.

Whilst the composition can be any colour, preferably the composition is coloured with a pigment which provides a readily noticeable colour against the colour of a typical roof e.g. bright orange. This makes it relatively easy for fire fighting personnel to see where the composition has been applied and to ensure that the solar panel is well covered. This also provides a clearly visible signal to others that the panel has been covered and the dwelling is electrically safe (at least from the solar panel). In some embodiments, however, the composition may be coloured white, black or grey.

The present invention is also particularly advantageous in that it can give a real-time indication of the electrical output of the solar cells. To explain, once the mains power to the dwelling has been switched off, the power output of the dwelling can be measured by a fire fighter (at the mains/utility box) whilst another fire fighter is coating the panels. Because the electrical response of the solar cells is almost instantaneous, the coating composition can be continuously applied until the person monitoring the electrical power box reports that the power has been reduced to zero, or to below a level which causes harmful physiological effects. This gives some confidence to the fire fighters that sufficient coating has been applied and that the electrical power level is indeed reduced, whereas otherwise it would simply be a guess or remain an unknown.

The skilled person will appreciate that the electrical output of the solar cell can be described by the voltage (volts), the current (Amps) and the power output (Watts). Preferably a 100 micron coating on a solar panel reduces the current to between 0.05 to 0.15% of an uncoated panel receiving solar insolation of between 0.9 to 1 kW/m$^2$. Preferably a 100 micron coating on a solar panel reduces the voltage to between 5 to 15% of an uncoated panel receiving solar insolation of between 0.9 to 1 kW/m$^2$. Preferably a 100 micron coating on a solar panel reduces the power output to between 0.005 to 0.05% of an uncoated panel receiving solar insolation of between 0.9 to 1 kW/m$^2$. The skilled person will appreciate that similar reductions in power output can be achieved with a thinner or a thicker coating, depending on the exact formulation of the coating composition.

The coating composition of the invention preferably comprises a homogenised blend of polymers and pigments with activators, flame retardants and adhesion adjustors to act as a removable extinguishing agent. The coating forms a solid blanket to block light resulting in shut-down of electrical output of a solar panel. Application can be by pressure vessel such as a fire extinguisher or manually by brush, roller or soft broom to form a solid blanket that can be subsequently removed.

In some preferred embodiments a single-use pre-charged vessel can be provided which contains a quantity of coating composition. The coating composition is adapted to electrically switch off a solar panel when coated thereon, and the vessel is pre-charged with a sufficient quantity of high-pressure inert gas such that the vessel can deliver the coating as a jet at a distance of 2, 5, 10 or more meters, in this embodiment the vessel is somewhat similar to a fire extinguisher, but the fire extinguishing medium is replaced with the coating composition of the invention. In other embodiments the vessel includes a hand-operated pump for manually pressurising the container so that fresh coating composition can be added and the vessel re-pressurised and re-used.

According to another aspect the present invention provides apparatus for delivering a coating composition onto the light-receiving area of a solar panel, the apparatus comprising:
  a pressurisable container for holding a quantity of said coating composition; and
  a delivery nozzle in fluid communication with tile container for delivering a spray or jet of said coating composition,
  wherein said container is pressurisable such that said coating composition is deliverable as a burst of a relatively confined jet or spray and to a distance of at least 2 meters.

Preferably the apparatus is sufficiently pressurised with an inert gas such that the coating composition is deliverable as a burst of a relatively confined jet or spray and to a distance of around 5 meters or more. Preferably the apparatus is delivered to the site of the solar panel and is ready for use, meaning that it already contains a quantity of coating composition and is already sufficiently pressurised. Preferably the delivery nozzle includes a hand-operated trigger for dispensing the costing composition on demand.

According to a further aspect, the present invention provides a method of electrically neutralising a solar panel, the method comprising the steps of:
  a.) coating the light-receiving area of said solar panel with a coating composition which is adapted to reduce the amount of light reaching the photovoltaic cells; and
  b.) measuring the electrical output of the solar panel,
  wherein if the resulting electrical output of said solar panel is not reduced to below a predetermined level then steps a.) and b.) are repeated until said electrical output is below said predetermined level.

The skilled addressee will understand that the invention comprises the embodiments and features disclosed herein as well as all combinations and/or permeations of the disclosed embodiments and features.

BRIEF DESCRIPTION OF THE DRAWINGS

Preferred embodiments of the invention will now be described, by way of example only, with reference to the accompanying drawings in which.

DEFINITIONS

In describing and claiming the present invention, the following terminology will be used in accordance with the definitions set out below. It is also to be understood that the terminology used herein is for the purpose of describing particular embodiments of the invention only and is not intended to be limiting. Unless defined otherwise, all technical and scientific terms used herein have the same meaning as commonly understood by one having ordinary skill in the art to which the invention pertains.

Unless the context clearly requires otherwise, throughout the description and the claims, the words 'comprise', 'comprising', and the like are to be construed in an inclusive sense as opposed to an exclusive or exhaustive sense; that is to say, in the sense of 'including, but not limited to'.

Other than in the operating examples, or where otherwise indicated, all numbers expressing quantities of ingredients or reaction conditions used herein are to be understood as modified in all instances by the term 'about'. The examples are not intended to limit the scope of the invention. In what follows, or where otherwise indicated, '%' will mean 'weight %', 'ratio' will mean 'weight ratio' and 'parts' will mean 'weight parts'.

The terms 'predominantly' and 'substantially' as used herein shall mean comprising more than 50% by weight, unless otherwise indicated.

The recitation of a numerical range using endpoints includes all numbers subsumed within that range (e.g., 1 to 5 includes 1, 1.5, 2, 2.75, 3, 3.80, 4, 5, etc.).

The terms 'preferred' and 'preferably' refer to embodiments of the invention that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

PREFERRED EMBODIMENT OF THE INVENTION

The present invention will now be described with reference to the following examples which should be considered in all respects as illustrative and non-restrictive.

Figure 1:
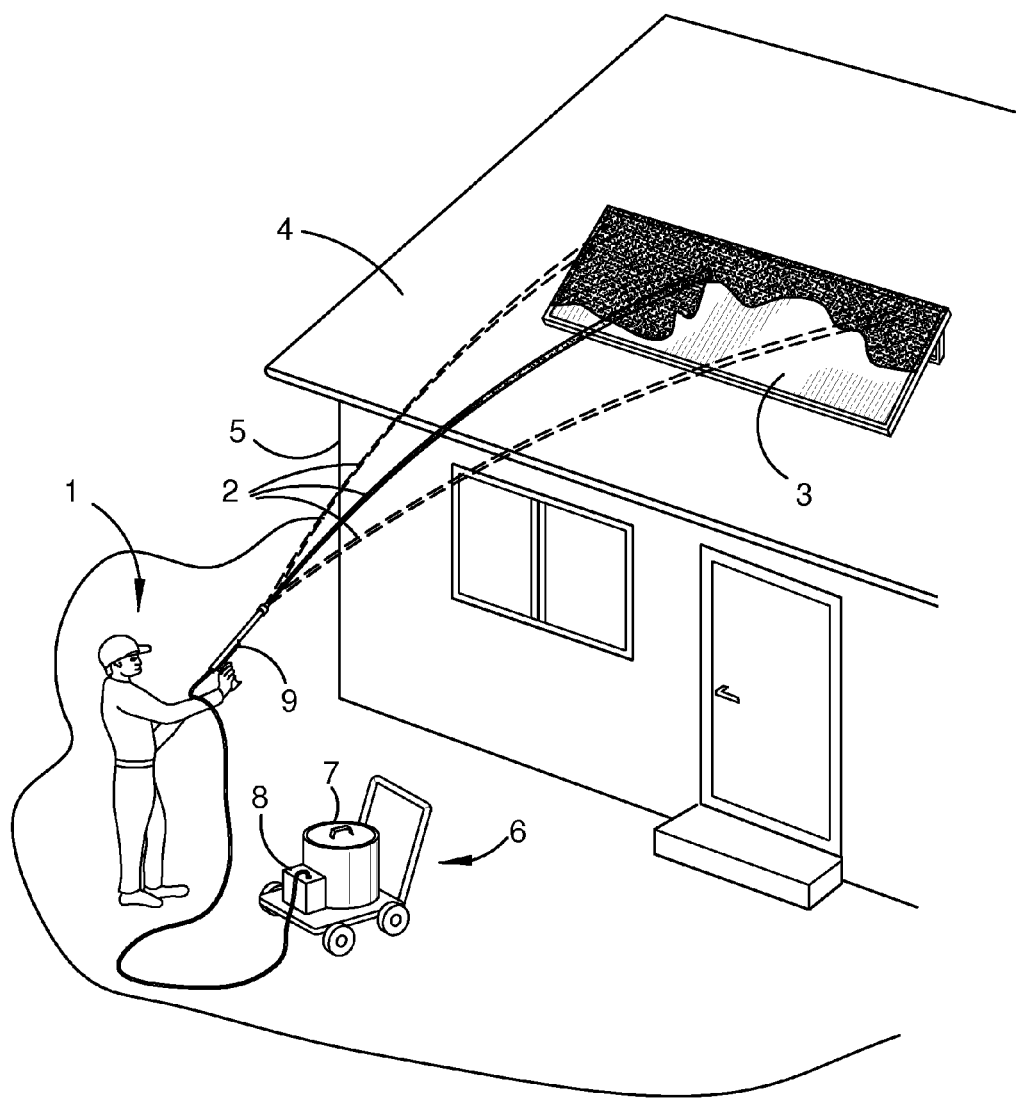
FIG. 1 is a pictures of a solar panel positioned on the roof of a building being coated from ground level.

FIG. 1 shows a person 1 spraying a coating composition 2 onto a solar panel array 3. The solar panel array 3 is positioned on a roof structure 4 of a building 5, and sufficient coating 2 is being applied to substantially cover the solar panel array 3 to reduce the light transmission to the solar panel's photovoltaic cells to reduce the electrical output of the solar panel array 3 to zero, and render it electrically safe. The coating composition 2 is being sprayed from the ground level and is being pumped from a delivery apparatus 6. The delivery apparatus comprises a container 7 for holding a quantity of the coating composition, a pump 8 for pumping the coating composition from the container 7 through a delivery nozzle 9. The pump 8 and delivery nozzle 9 are configured such that the coating composition 2 is deliverable as a burst of a relatively confined jet or a spray. It will be appreciated that the solar panel array 3 could positioned at the ground level, or could be on a second or even third story of a building.

A solar panel (sourced from ET Solar; ET-M53620; 20 watt unit; 299 mm×662 mm) was placed in a generally upright position and coated with surface coating over an approximately 6 second period to result in a coated panel. The coating material used to coat the panel was Spraylat International Protectapeel Multisurface, with the addition of a black paint pigment. The concentration of pigment added was approximately 5 wt %. The delivery system was a pressurisable container having a delivery nozzle and trigger. The container was pressurised sufficiently such that when the coating material was discharged it was sprayable from about 4 meters away onto the solar panel. The current and voltage output of the solar cell was measured before, during and after the coating operation. The measurements were made using a Prova 200 Solar Module Analyser for the I-V curves and TES 1333R Datalogging Solar Power Meter to estimate the solar insolation. Solar insolation was approximately 0.9 to 1 kW/m².

Figure 2:
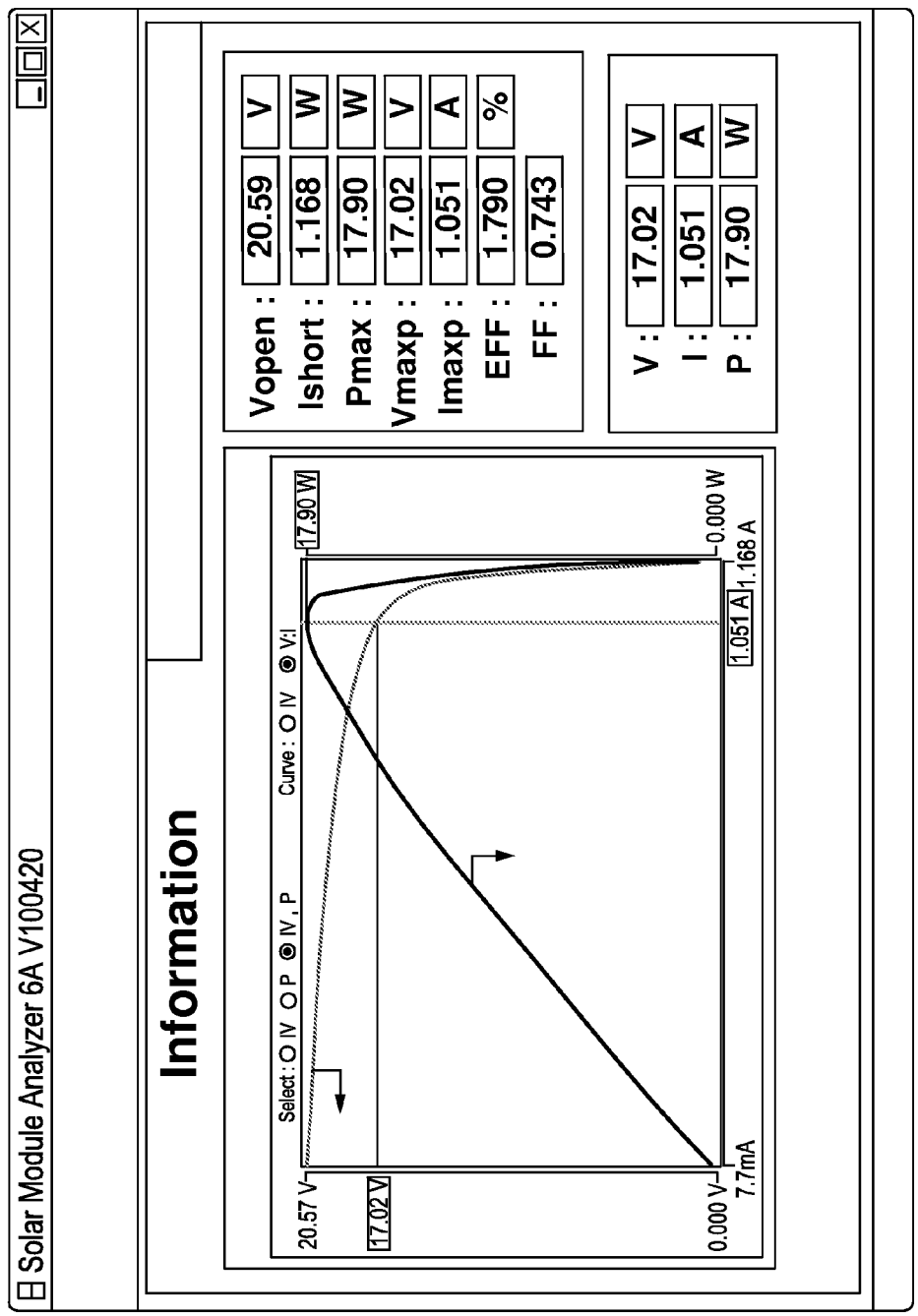
FIG. 2 is a screen shot of a current-voltage output graph of a solar panel without a coating and receiving approximately 1 kW/m² of sunlight.
Figure 3:
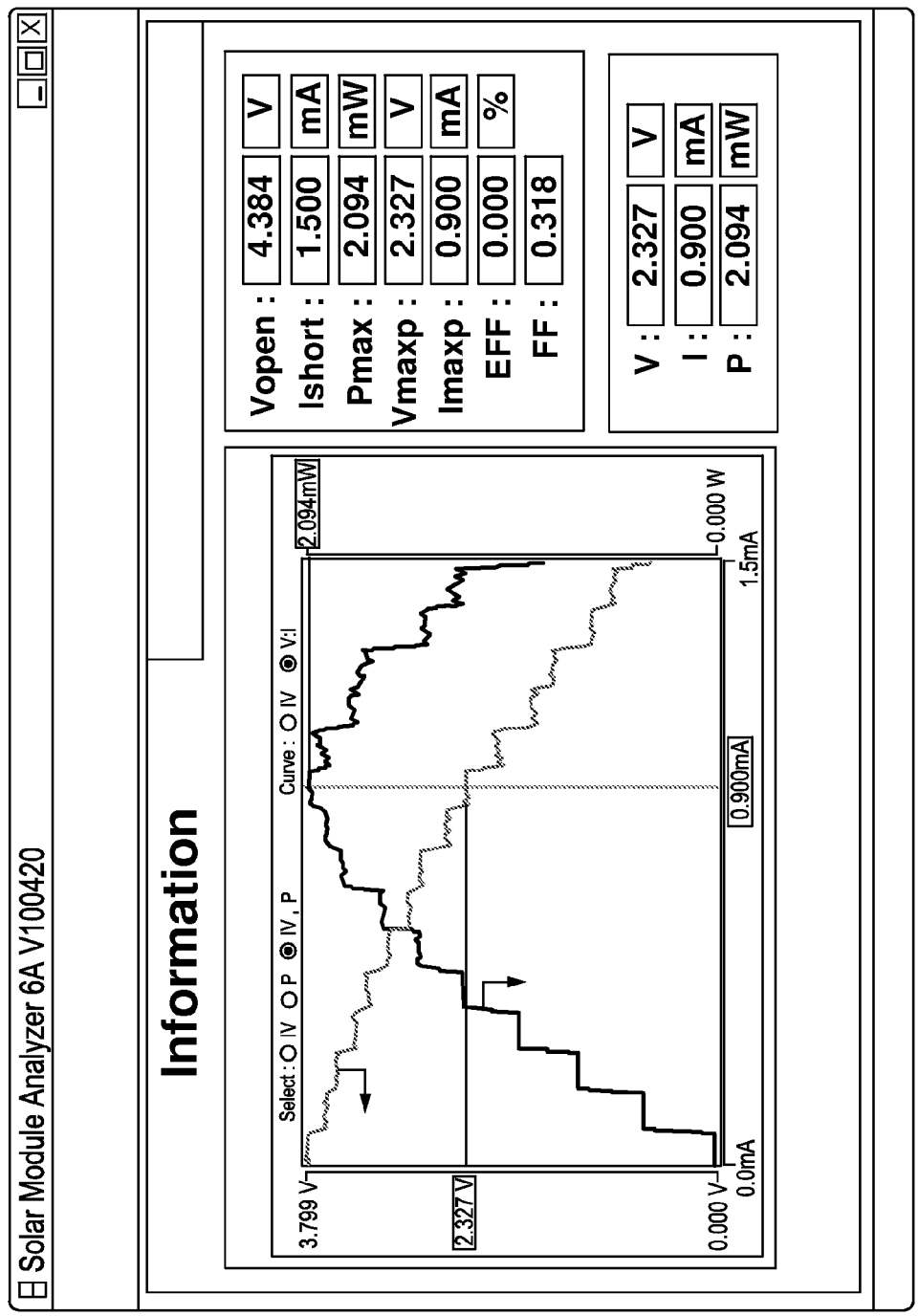
FIG. 3 is a screen shot of a current-voltage output graph of a solar panel having a surface coating including a black pigment, approximately 2 minutes after coating was delivered to the surface and receiving approximately 1 kW/m² of sunlight.
Figure 4:
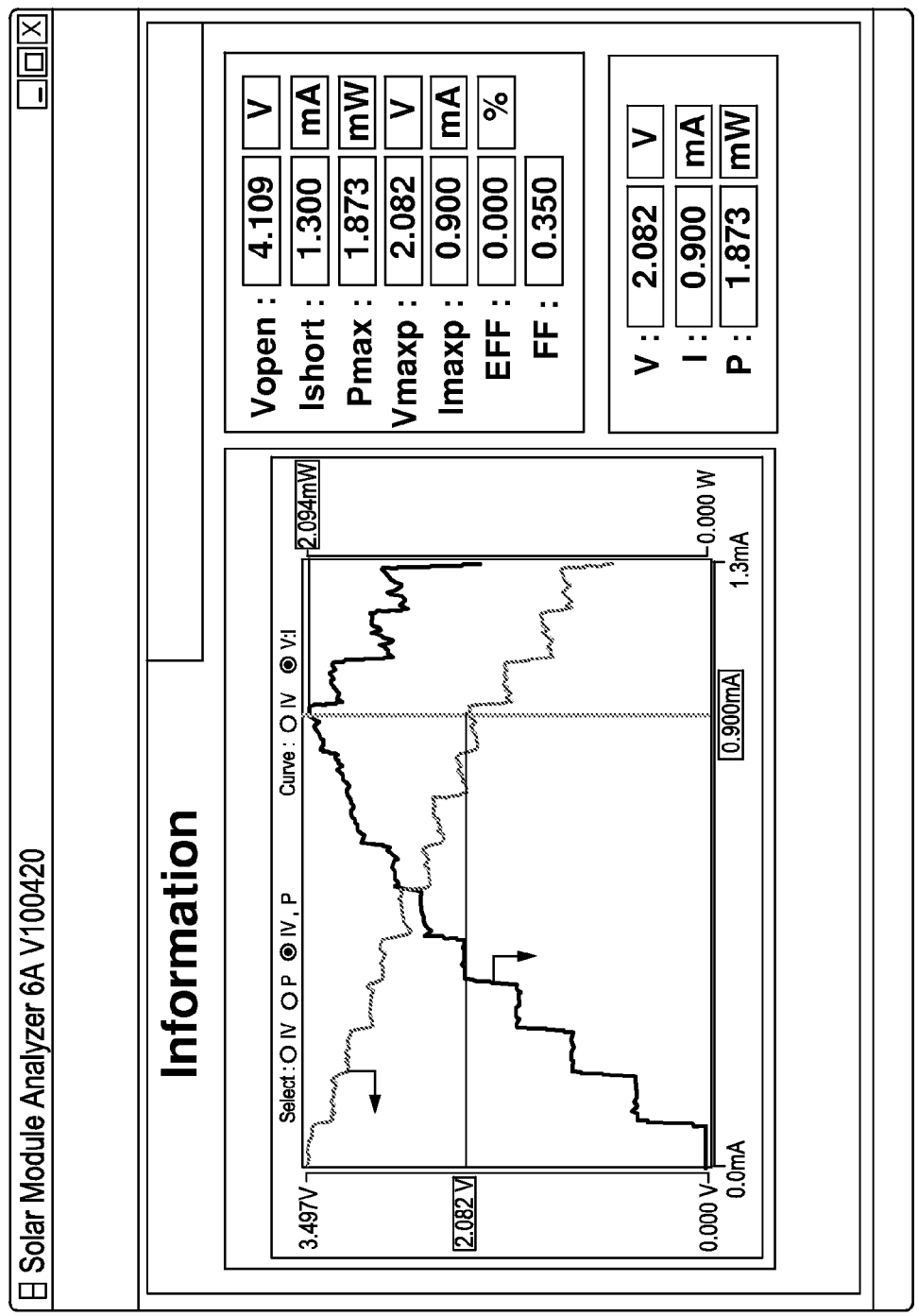
FIG. 4 is a screen shot of a current-voltage output graph of the panel with a surface coating including black pigment, approximately 62 minutes after coating and receiving approximately 1 kW/m² of sunlight.

Referring now to FIG. 2, it can be seen that the uncoated panel delivered a maximum current of 1.051 Amps, a maximum voltage of 17.02 Volts, and a maximum power output of 17.9 Watts. Referring now to FIG. 3, two minutes after the panel was coated the voltage dropped to 2.327V, the current dropped to 0.9 milliAmps, and the power output dropped to 2.09 milliWatts. Approximately 1 hour after the coating was applied the power output of the panel was again measured and the results were almost identical to those obtained 2 minutes after the coating was applied (see FIG. 4). It can be seen that the electrical output of the coated panel is below that which would cause harmful physiological effects, as described in the relevant Australian Standard discussed above.

Although the invention has been described with reference to specific examples, it will be appreciated by those skilled in the art that the invention may be embodied in many other forms. In particular features of any one of the various described examples may be provided in any combination in any of the other described examples.

The claims defining the invention are as follows:

1. A method for coating a solar panel to reduce the amount of light being received by the solar panel's photovoltaic cells, the method comprising the step of:
    coating the light-receiving area of said solar panel with a sufficient thickness of a coating composition comprising a binder and a sufficient quantity of an opacifier such that said coating composition reduces light transmission therethrough such that the resulting electrical output of said solar panel is reduced to below a predetermined level, wherein the predetermined level is about 200 milliAmps DC.

2. The method according to claim 1, wherein the thickness of the coating is between about 50 to 150 micron, thereby to reduce the light transmission to below 0.1% of incident light.

3. The method according to claim 2, wherein the resulting electrical output is reduced to below 1% of the electrical output compared to the solar panel's electrical output without an applied coating.

4. The method according to claim 3, wherein the resulting electrical output is measured in current and is reduced to less than 0.20% of the current of an uncoated panel; or wherein the resulting electrical output is measured in volts and is reduced to less than 20% of the voltage of an uncoated panel; or wherein the resulting electrical output is measured in Watts and is reduced to less than 0.10% of the Wattage of an uncoated panel.

5. The method according to claim 1, wherein the step of coating the solar panel is performed prior to shipping, prior to delivery, prior to installation, during installation, prior to or during servicing, prior to or during a flooding scenario, prior to or during an electrical fault, or prior to or during a fire scenario.

6. The method according to claim 1, wherein said composition includes a release agent such that the coating, when it has cured, is relatively easily released from the solar panel and any surrounding structures upon which the coating composition has been applied; or wherein said composition is formulated to include a fire retardant additive; or wherein said composition is formulated to include a UV-stabiliser such that the coating does not degrade over about 6 weeks in sunlight.

7. The method according to claim 1, wherein said composition comprises between 5-20 wt % of said opacifier.

8. The method according to claim 7, wherein the opacifier is selected from the group consisting of titanium dioxide, calcium carbonate, zinc oxide, talc, carbon black, expanded thermoplastic microspheres, and any combination thereof.

9. The method according to claim 1, wherein the binder is a water-based binder selected from the group consisting of water-soluble polymers, dispersions, emulsions, and lattices.

10. The method according to claim 1, wherein the composition is formulated to cure to a substantially dry film within 1-5 minutes.

11. The method according to claim 1, wherein the composition is absent UV inhibitors, or wherein the composition further comprises at least one additive which accelerates UV-destruction of the resultant coating such that the resultant coating is substantially degraded by sunlight within 2 to 6 weeks of exposure.

12. The method according to claim 1, wherein the composition is coated onto the solar panel as a cohesive sheet.

13. A composition for coating the light-receiving area of a solar panel to reduce the amount of light being received by the solar panel's photovoltaic cells, the composition comprising:
    a binder; and
    an opacifier,
    wherein said opacifier is included in a sufficient quantity such that a sufficient film thickness of said composition reduces light transmission therethrough such that the resulting electrical output of said solar panel is reduced to below a predetermined level, wherein the predetermined level is about 200 milliAmps DC.

14. The composition according to claim 13, wherein said composition includes a release agent such that the coating, when it has cured, is relatively easily released from the solar panel and any surrounding structures upon which the coating composition has been applied.

15. The composition according to claim 13, wherein said composition further comprises a fire retardant additive.

16. The composition according to claim 13, wherein said composition further comprises a UV-stabiliser such that the coating does not degrade over about 6 weeks in sunlight.

17. The composition according to claim 13, wherein said composition comprises between 5-20 wt % of the opacifier.

18. The composition according to claim 13, wherein the opacifier is selected from the group consisting of titanium dioxide, calcium carbonate, zinc oxide, talc, carbon black, expanded thermoplastic microspheres, and any combination thereof.

19. The composition according to claim 13, wherein the binder is a water-based binder selected from the group consisting of water-soluble polymers, dispersions, emulsions, and lattices.

20. The composition according to claim 13, wherein the composition is formulated to cure to a substantially dry film within 1-5 minutes.

21. The composition according to claim 13, wherein the composition is absent UV inhibitors, or wherein the composition further comprises at least one additive which accelerates UV-destruction of a coating or film prepared from said composition such that the coating or film is substantially degraded by sunlight within 2 to 6 weeks of exposure.

22. A method of electrically neutralising a solar panel, the method comprising the steps of:
   a.) coating the light-receiving area of said solar panel with a coating composition comprising a binder and an opacifier such that a film of said coating composition reduces light transmission therethrough to reduce the amount of light reaching photovoltaic cells of said solar panel; and
   b.) measuring electrical output of the solar panel, wherein if the resulting electrical output of said solar panel is not reduced to below a predetermined level which neutralises said solar panel, then steps a.) and b.) are repeated until said electrical output is below said predetermined level, wherein the predetermined level is about 200 milliAmps DC.

* * * * *